United States Patent [19]
Faris

[11] Patent Number: 4,837,604
[45] Date of Patent: Jun. 6, 1989

[54] FEMTOSECOND THREE-TERMINAL SWITCH AND VERTICAL TUNNEL JUNCTION

[75] Inventor: Sadeg M. Faris, Yorktown Heights, N.Y.

[73] Assignee: Hypres, Inc., Elmsford, N.Y.

[21] Appl. No.: 853,738

[22] Filed: Apr. 18, 1986

[51] Int. Cl.⁴ .................. H03K 17/92; H01L 39/22
[52] U.S. Cl. ............................... 357/5; 307/306
[58] Field of Search ............ 357/5; 307/277, 305, 307/306

[56] References Cited

U.S. PATENT DOCUMENTS

| | | | |
|---|---|---|---|
| 3,643,237 | 2/1972 | Anacker | 357/5 X |
| 3,906,538 | 9/1975 | Matisoo | 357/5 |
| 4,051,393 | 9/1977 | Fulton | 307/306 |
| 4,117,503 | 9/1978 | Zappe | 357/5 |
| 4,157,555 | 6/1979 | Gray | 357/6 |
| 4,334,158 | 6/1982 | Faris | 307/462 |
| 4,589,001 | 5/1986 | Sakai et al. | 357/5 |
| 4,638,257 | 1/1987 | McDonald | 307/306 X |

FOREIGN PATENT DOCUMENTS 0024416  2/1980  Japan ........................... 357/5

OTHER PUBLICATIONS

Faris, "VLSI Superconducting Technologies", Chapter 9 of *Hardware and Software Concepts in VLSI*, at 177–238 (1983).
Faris et al., "Basic Design of a Josephson Technology Cache Memory", *IBM J. of Res. & Development*, vol. 24 (1980), pp. 143–154.
Gueret et al., "Investigations for a Josephson Computer Main Memory with Single-Flux-Quantum Cells", *IBM J. of Res. & Development*, vol. 24 (1980), pp. 155–166.
Zappe and Landman, "Analysis of Resonance Phenomena in Josephson Interferometer Devices", *J. Appl. Phys.*, vol. 49, pp. 344–350 (1978).
Harris, "Turn-on Delay of Josephson Interferometer Logic Devices", *IEEE Trans. on Magnetics*, vol. MAG-15, pp. 562–565 (1979).
Zappe, "Dynamic Behavior of Josephson Tunnel Junctions in the Subanosecond Range", *J. Appl. Phys.*, vol. 44, pp. 865–874.
Arnett and Herrell, "Regulated AC Power for Josephson Interferometer Latching Logic Circuits", *IEEE Trans. on Magnetics*, vol. MAG-15, pp. 554–557 (1979).
Faris, "Quiteron", *Physica*, vol. 126B, pp. 165–175 (1984).
Tucker, "Predicted Conversion Gain in Superconductor-Insulator-Superconductor Quasiparticle Mixers", *Appl. Phys. Lett.*, vol. 36, pp. 477–479 (1980).
Kerr et al., "Infinite Available Gain in a 115 GHz SIS Mixer", *Physica*, vol. 108B, pp. 1369–1370.
Rudner et al., "The Antenna-Complex SIS Quasiparticle Array Mixer", *IEEE Trans. on Magnetics*, vol. MAG-17, pp. 690–693 (1981).
Zappe, "Josephson Computer Technology", Published in Deaver, *Advances in Superconductivity* (Plenum 1983), pp. 51 et. seq.
Jillie, "All-Refractory Josephson Logic Circuits", *IEEE J. of Solid State Circuits*, vol. SC-18, pp. 173–180 (1983).
Huggins, "Preparation and Characteristics of Nb/Al-oxide-Nb Tunnel Junctions".
Gurvitch, "Quality Refractory Josephson Tunnel Junctions Utilizing Thin Aluminum Layers", *Appl. Phys. Lett.*, vol. 42, pp. 472–474 (1983).

*Primary Examiner*—Thomas H. Tarcza
*Assistant Examiner*—Gilberto Barrón, Jr.
*Attorney, Agent, or Firm*—Kenyon & Kenyon

[57] ABSTRACT

A circuit element for a superconducting integrated circuit is disclosed which comprises a plurality of Josephson junctions stacked vertically atop one another. Such a circuit element is capable of replacing single junctions and lateral arrays of junctions in many analog and digital applications. When operated digitally, the close proximity of the junctions to one another creates a "tight coupling" effect which permits the entire stack to switch as a single junction. Input (control) currents and output (bias) currents can be injected or taken out at any level or levels in the stack, thereby permitting excellent isolation, voltage gain, and the use of a single stack as a combination logic element. The use of tight coupling is extendable to lateral arrays as well. A method by which a circuit including vertical tunnel junctions may be fabricated is also disclosed.

43 Claims, 6 Drawing Sheets

FEMTOSECOND THREE-TERMINAL SWITCH AND VERTICAL TUNNEL JUNCTION

BACKGROUND OF THE INVENTION

1. Field of the Invention

The invention relates to superconducting integrated circuit technologies and more particularly to a novel circuit element for use with such technologies.

2. Description of Related Art

Background information on superconducting technology may be found in Faris, "VLSI Superconducting Technologies," chapter 9 of *Hardware and Software Concepts in VLSI*, at 177-238 (1983) (hereinafter "Faris 1983") and in Zappe, "Josephson Computer Technology". Faris 1983 describes the well known Josephson junction in addition to many known superconducting circuit structures. It also points out many of the difficulties and limitations of known superconducting devices and circuits, including the following:

1. Inherent switching speed limitations. Most superconducting circuits which use Josephson junctions can be modelled as one of the three equivalent circuits shown in FIGS. 1(a), 1(b) and 1(c). FIG. 1(d) shows an equivalent circuit for the junction itself. When the junction in each such circuit switches from the novoltage state to the voltage state, a portion of the gate current $I_g$ is transferred to the load with the following transfer times for FIGS. 1(a), 1(b) and 1(c), respectively:

$$\tau_a \propto R_L C_j \ (R_L \approx Z_o)$$

$$\tau_b \propto \frac{L_L I_g}{V_g} \ (L_L \gtrsim 2000 pH)$$

$$\tau_c \propto \sqrt{L_L C_j} \left( V_{out} < V_g; R_L << \sqrt{\frac{L_L}{C_j}} \right),$$

where $C_j$ is the junction capacitance, $V_g$ is the gap voltage of the junction, $V_{out}$ is the voltage across the junction, and $R_L$ and $L_L$ are the load resistance and inductance, respectively. The goal, of course, is to transfer as much of the current to the load as possible, as quickly as possible. These time periods are typically much larger and much more limiting than the intrinsic Josephson junction response time, which in the limit of zero junction capacitance is given by $$\tau_{intr} = \frac{\hbar}{2\Delta},$$

where $\Delta$ is the superconducting energy gap. The limitations are felt most severely in memory applications, where speed and density are extremely important. Typical memory configurations are described in Faris 1983 at 208-229; in Faris, et al., "Basic Design of a Josephson Technology Cache Memory," *IBM J. Of Res. & Development*, Vol. 24 (1980), pp. 143-154 (hereinafter "Faris, et al. 1980"); and in Guéret, et al., "Investigations for a Josephson Computer Main Memory with Single-Flux-Quantum Cells," *IBM J. of Res. & Development*, Vol. 24 (1980), pp. 155-166. It can be seen from these references that a typical memory operates through the transfer of current into and out of high impedance current paths (modelled like FIG. 1(a)) and/or long memory access loops (modelled like FIG. 1(b)). In order to improve speed, the Faris, et al. 1980 paper at p. 149 recognizes the desirability of using two series-connected driver gates (interferometers) instead of one. In circuits having transmission lines terminated with their characteristic impedance (FIG. 1(b a)), an improvement appears because two series-connected capacitors $C_j$ have an overall capacitance of $C_j/2$. In circuits having an inductive characteristic (FIG. 1(b)), the improvement appears because the effective gap voltage doubles to $2V_g$. Both situations result in a halving of the relevant current transfer times. The halving of the overall capacitance also reduces the switching time by a factor of $SQR(\frac{1}{2})$ in FIG. 1(c) circuits.

This scheme for speeding up current transfer cannot be extended to more than 3 or 4 series gates, however, for several reasons. First, the speed benefits obtain only if all gates switch *simultaneously,* that is, only if the time required to transmit energy to the load is much greater than the time between switching of the first and last gate. Simultaneity is difficult to achieve since the gates are separated physically, and a certain amount of time is required for a control current to transverse the distance between one gate and another. The several gates must also be driven by a very fast buffer in order to minimize the effects of fabrication mismatch and in order to minimize the length of time that the junctions are in a grey region where they may or may not switch. Such buffers can occupy significant space on the chip and therefore reduce the overall density of the memory. Additionally, the several gates must be virtually identical in their construction in order that they respond identically to the control signal. This requires extremely tight fabrication tolerances which are difficult to achieve. Moreover, the driver gates must usually fit in the pitch between memory access loop conductors, because the drivers are usually placed along two adjacent edges (one for X and one for Y) of the memory cell array. If one driver circuit exceeds the pitch it will begin to overlap the space of the next driver circuit. Adding series driver gates therefore imposes undesirable limitations on the density of the memory cell array itself.

2. Resonance phenomena. It has been shown that the voltage-current relationship of a Josephson junction is governed by the following two equations:

$$I_j = I_o (\Delta) \sin (\phi_1 - \phi_2) \quad (1)$$

$$V_j = \frac{\Phi_o}{2\pi} \frac{d}{dt} (\phi_1 - \phi_2) \quad (2)$$

where $\phi_1$ and $\phi_2$ are the phases of the superconductive order parameters of the two superconductors, $V_j$ is the voltage across the junction, and $\Phi_o$ is the unit flux quantum ($2.07 \times 10^{-15}$ Wb). If equation (2) is integrated and solved for $\phi_1 - \phi_2$, and the result inserted into equation (1), it can be seen that the current $I_j$ through the junction will oscillate according to the voltage across it. For a D.C. voltage $V_j = V_{dc}$, the Josephson oscillation frequency is approximately $f_j/V_{dc} = 483$ GHz/mV. This is the so-called AC Josephson effect.

Many practical superconducting circuits use interferometers as the switching element instead of bare Josephson junctions. An example of a two-junction interferometers is shown in FIG. 2(a). As can be seen, the two junctions are connected together through an inductor, and the Josephson oscillations of each can be expected to influence the other. To a first approximation, the voltage across each junction becomes $$V_j = V_{dc} + v_o \sin(\omega_{rf} t)$$

When this is inserted into equations (1) and (2) above and the other components of the interferometer are factored in, it can be shown that the oscillations in current through the interferometer will appear at discrete resonance voltages of $(2n+1)V_r$, where $$V_r = \frac{\hbar}{2e} \sqrt{\frac{2}{LC_j}},$$

L being the value of the main inductance and $C_j$ being the capacitance of each of the two junctions (considered for the purposes of this illustration to be equal). Interferometer resonances are described in Zappe and Landman, "Analysis of Resonance Phenomena in Josephson Interferometer Devices," *J. Appl. Phys.*, Vol. 49, pp. 344-350 (1978).

The amplitude of the current steps in an interferometer can be sufficiently large that they interfere with the use of the device as the switching element in a circuit. This interference can be understood by referring to FIG. 2(b), which shows the interferometer I-V characteristic 10 with a resistive load line 12 shown superimposed thereon. A circuit such as that of FIG. 1(a) (with the junction replaced by an interferometer) will produce this type of characteristic. The interferometer curve 10 includes a portion 14 showing a nonzero Josephson gate current $I_g$ flowing when $V=0$, and two current steps 16 located at the fundamental and first harmonic voltages $V_r$ and $2V_r$.

It is assumed that the switching element is to be operated by varying the applied magnetic field such that the maximum Josephson current level of the interferometer reduces from $I_m$ to $I_m'$. It is also assumed that the applied gate current $I_g$ is between $I_m$ and $I_m'$ in magnitude. When the maximum Josephson current level is $I_m$, the entire gate current $I_g$ flows through the junctions and the junctions remain in the no-voltage state. When the maximum Josephson current level is shifted down to $I_m'$, the junction would ideally switch to the voltage state shown as 18 in FIG. 2(b). The voltage $V_v$ across the device would then be given by $I_gR$, where R is the parallel combination of the load resistance $R_L$ (not shown in FIG. 2(a)) and the voltage dependent junction resistance $R_j(V)$.

However, as seen in FIG. 2(b), the amplitudes of some of the resonance current steps are large enough to intersect the load line 12. Consequently, instead of switching from $V=0$ to $V=V_v$, the device may instead jump into one of the resonant modes represented by current steps 16. The device has a very low resistance in these modes, thereby preventing the desired current transfer to the load. Additionally, the device may jump from one resonant mode to another in an erratic manner. In any case it will be appreciated that the failure of the junction to switch immediately to $V_v$ hinders the junction's usefulness as a logic device. One solution to the resonance problem is described in U.S. Pat. No. 4,117,503 to Zappe. It involves connecting a damping resistor $R_d$ across the main inductance of the interferometer in order to dampen the resonances. This solution has limitations because the need to use a damping resistor of low inductance necessitates the use of a topology such as that shown in FIG. 5 of that patent. This may be undesirable or inconvenient in certain circumstances, and therefore imposes undue restrictions on circuit design flexibility. The topology also limits the achievable circuit density. Additionally, as reported by Harris in "Turn-on Delay of Josephson Interferometer Logic Devices," *IEEE Trans. on Magnetics*, Vol. MAG-15, pp. 562-565 (1979), the addition of a damping resistance introduces a turn-on delay factor not previously present.

Resonance phenomena also appear in bare Josephson junctions, if the junctions are made too large to be treated as "point" junctions. These are described in Zappe, "Dynamic Behavior of Josephson Tunnel Junctions in the Subnanosecond Range," *J. Appl. Phys.*, Vol. 44, pp. 865-874 (1973), and one solution applicable in that context is given in U.S. Pat. No. 3,906,538 to Matisoo and Zappe.

3. Latching Property. A Josephson junction is normally a latching device. When it switches from the no-voltage state to the voltage state it will remain there indefinitely until the gate current is reduced to zero. This is inconvenient for logic applications because it means that an AC gate current must be used in order to periodically reset the device. The speed at which a combinational circuit can perform its function and be ready for more data is limited by the frequency of this AC gate current. Latching logic circuitry also requires a specialized power supply and power distribution scheme such as that described in Arnett and Herrell, "Regulated AC Power for Josephson Interferometer Latching Logic Circuits," *IEEE Trans. on Magnetics.* Vol MAG-15, pp. 554-557 (1979).

To avoid these problems many circuits are designed to operate in a non-latching mode. Such a mode is achieved if the voltage $V_j$ across the device never exceeds the self-resetting voltage $V_{min}(c)$, given by $$\frac{1}{2} C_j V_{min}^2 = \frac{I_m(I_c)\Phi_o}{2\pi}.$$

FIG. 3(a) shows the typical variation of $V_{min}$ as a function of an applied control current $I_c$. It is periodic in $I_c$, having a maximum and minimum value of $V_{minh}$ at $V_{minl}$, respectively. These values are on the order of 0.4 mV. The shaded area below the curve represents the no-voltage state of the junction, and the area above the curve represents the voltage state. If the load is chosen such that $V_j$ in the voltage state is always below the curve, no amount of control current will cause the junction to switch into the voltage state. Alternatively, if $V_j$ is always above the curve, the junction will be in the voltage state even if $I_c$ is zero. Only if $V_j$ remains between $V_{minl}$ and $V_{minh}$ will the junction switch to the voltage state when an appropriate $I_c$ is applied, and then switch back to the no-voltage state (i.e., reset itself) when $I_c$ is removed. This is shown in FIG. 3(b).

Thus, in order to achieve non-latching operation, the load must be chosen such that $V_v$, the voltage across the junction when it is in the voltage state, is between $V_{minl}$ and $V_{minh}$. This is a very small range, requiring tight processing tolerances which are difficult to meet. Also, as shown in FIG. 3(b), the usable range of control currents $I_c$ is also limited. Additionally, in circuits where the load is a terminated transmission line, the transmission line impedance must be very small, on the order of 1 ohm, in order to obtain the desired load line slope. Such transmission lines must be made very wide, which results in low density, low speed and low yield.

4. Gain. A Josephson junction is a two terminal device having a gain defined as $I_g/I_c$. When biased near its threshold, this gain can be large in principle. In practice it is often less than unity, however, because the junction is biased well below its threshold to avoid inadvertent switching by noise sources and to accommodate parameter variations that are inevitable in the LSI environment. By arranging a plurality of junctions in inductive networks (interferometer circuits) or resistive networks (current injection circuits), a gain larger than unity is obtainable. For example, in transformer-coupled devices such as interferometers, a current gain can be achieved by using a large inductance in the control winding or by using more than one control winding. But such gain is always at the expense of more area, and it necessitates tight control on parameter tolerances to achieve high chip yield. The crucial parameters are threshold current $I_m(I_c)$, power regulation, resistors, and junction capacitance. The threshold current variations are the most challenging ones to control at tolerances below 10% since they depend on variations in area and current density. The latter depend on the tunnel barrier thickness. Since the barrier thickness is only tens of angstroms, it has to be uniform within fractions of an angstrom as a result of the exponential thickness dependency of the tunneling probability. Moreover, resort to interferometer structures to achieve current gain is undesirable because it introduces resonances, as described above. No superconducting device proposed to date has been able to achieve a voltage gain for large signals.

The difficulty in obtaining gain renders multi-stage circuits difficult to design and fabricate. It also renders communication from the cryogenic environment to the room temperature environment difficult, since the voltage swings used in superconducting circuits are in the millivolts and the voltage swings used in room temperature technologies are in the volts. A large voltage gain would be required for effective communication.

5. Isolation. In order for a switching element to be most useful, it is desirable that the output signal be isolated from the input signal. That is, an appropriate change in the input signal should affect the output signal, but any change in the output, even if due to external influences, should have an affect on the input which is at most negligible. A bare Josephson junction, being a two-terminal device, does not satisfy this condition. Transformers, which are four-terminal passive elements, are used to provide isolation in Josephson circuits. The primary carries the input $I_c$, and the secondary is either the junction itself (in which case the magnetic field of the transformer acts directly to lower the critical current level), or a separate loop connected to the junction (in which case a current is induced, adding to $I_g$ and switching the junction as its critical current is exceeded). The latter is shown in FIG. 2(a). Transformer coupling is only an artificial means for achieving isolation, however, and does not operate at the microscopic level of the Josephson device itself. It therefore is much larger than the physical scale of the films and barriers used in the junction. Circuit density is limited not by the active element, but by the passive element needed to provide isolation.

A three-terminal superconducting transistor is disclosed in U.S. Pat. No. 4,157,555 to Gray. This device provides isolation, but is severely limited in many other respects. In particular, it must be fabricated using materials which are sub-optimal from a superconducting viewpoint, and its output level is too small for use in digital applications. In U.S. Pat. No. 4,334,158, there is described another superconducting device, called a Quiteron, which solves or avoids many of the problems described above. The Quiteron is described further in Faris, "Quiteron," *Physica*, Vol. 126B, pp. 165–175 (1984). It comprises a tunnel junction which has a threshold power density above which the superconducting gap of the superconducting electrode vanishes. The device operates via a heavy injection of quasi-particles into the superconductor, and does not use the Josephson effect. However, Quiterons do not have sufficient voltage gain and do not exhibit a large enough voltage swing. Quiterons are also relatively slow devices, even slower than the Josephson junction.

SUMMARY OF THE INVENTION

It is therefore an object of the present invention to provide a means for avoiding some or all of the above difficulties.

It is another object of the invention to provide a novel switching element which will switch a plurality of junctions simultaneously.

It is another object of this invention to provide a three terminal superconducting device which can be fabricated in very dense structures.

It is another object of this invention to provide a superconducting switch which has a voltage gain and which can exhibit non-latching operation.

It is another object of the present invention to provide a superconducting switch which can be designed to exhibit no resonance.

It is another object of the present invention to provide a superconducting switch having distinguishable output states in which the output of one switch can be used to drive the input of a second switch in order to cause the state of said second switch to change when such input is present.

It is another object of the present invention to provide an extremely fast switch.

It is another object of the present invention to provide a circuit element which can operate in a non-latching mode.

It is another object of the present invention to provide a circuit element which exhibits isolation.

It is another object of the present invention to provide a circuit element which is capable of replacing Josephson junctions in digital and non-digital applications.

These and other objects are achieved according to the invention by providing a switch, having junctions stacked vertically, in a tightly coupled manner, so that superconducting electrodes of adjacent junctions are shared. Because of device physics, an external influence sufficient to switch one junction into the voltage state will also cause all the other junctions in the stack to switch, through a domino-like effect, so that the entire stack acts as a single junction. Such a switch could also be made by disposing the junctions laterally, but such junctions would have to be fabricated less than about 1000 Å apart in order to achieve tight coupling. The vertical tunnel junction structure is also usable in non-digital applications where tight coupling might not be essential. Even in these applications, however, tight coupling may be advantageous.

BRIEF DESCRIPTION OF THE DRAWINGS

The invention will be described with respect to specific embodiments thereof. Reference will be made to the drawings, in which like members are given like designations, and in which.

DETAILED DESCRIPTION

Figure 4A:
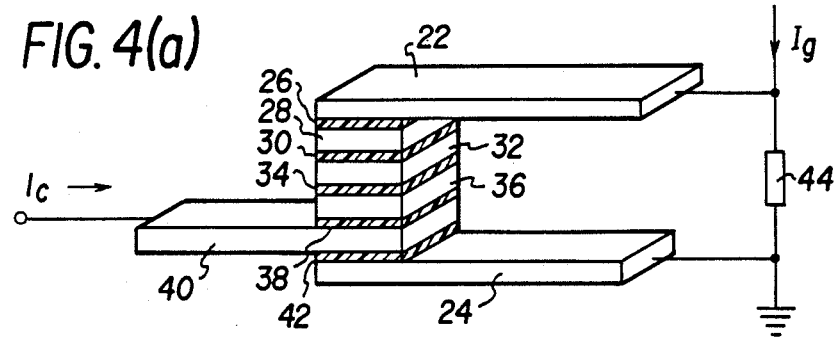
FIGS. 4(a), 4(b), 7, 8 and 10 show vertical tunnel junction structures embodying the present invention.

In FIG. 4(a) there is shown a three-terminal Vertical Tunnel Junction (VTJ) according to the invention. It comprises a top superconductor 22 and a bottom superconductor 24, between which are sandwiched four superconductor layers 28, 32, 36 and 40, and five very thin barrier layers 26, 30, 34, 38 and 42. The superconductor and barrier layers are stacked alternately so that there is a barrier layer between every pair of superconductor layers. The top superconductor 22 is the output terminal, the bottom superconductor 24 is common, and the superconductor 40, closest to the bottom superconductor 24, is the input terminal. Although a VTJ having N=5 barrier layers is shown, any number of layers greater than N=1 will suffice. The barrier layers are made thin enough so that each barrier layer acts with its two adjacent superconductors to form a junction. As long as each junction is tightly coupled to the next, the entire stack will switch via a domino effect as a single junction.

In operation, the device is biased with a gate current $I_g$ passing vertically through the stack, where the gate current is slightly below the lowest threshold current level of any junction in the stack. With no control current $I_c$ applied, all the junctions in the stack will be in their zero-voltage state. Since the layers separating the junctions are all superconductors, the total voltage drop across the stack is zero and the current delivered to the load 44 is zero. As soon as sufficient control current $I_c$ is injected into the input terminal 40 to cause the bottom junction to switch to the voltage state, all the junctions in the stack switch virtually simultaneously. Gate current is thereby transferred to the load.

A vertical tunnel junction according to the invention has at least three major advantages over the prior art Josephson junction. One is that, since a VTJ represents N junctions connected in series, the total capacitance $C_{vtj}$ is reduced by a factor of $1/N$. Since they are tightly coupled, the switching time from the first to the last junction in the VTJ is inherently much shorter than the time required to transmit energy to the load. There is no necessity for a control current to traverse a distance between spacially separated gates, no necessity that the control current be driven by a very fast buffer, and no necessity that all the junctions be constructed identically. Nor does a VTJ occupy any more area on a chip than a single Josephson junction, since the junctions which make up the VTJ are stacked vertically.

Figure 1A:
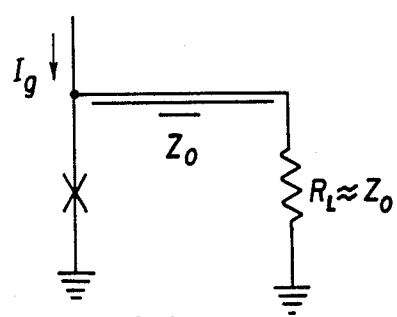
FIGS. 1(a)–1(c) show models for prior art circuits which use Josephson junctions.
Figure 1B:
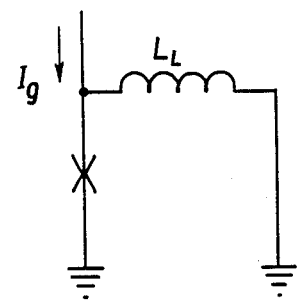
Figure 1C:
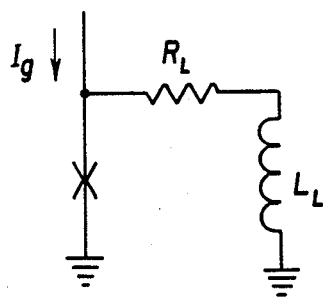
Figure 1D:
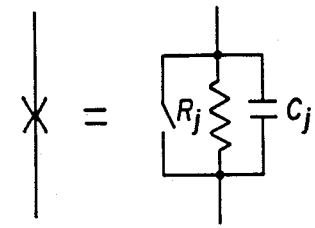
FIG. 1(d) shows an equivalent circuit model for a Josephson junction.
Figure 2A:
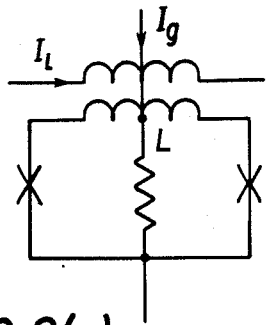
FIG. 2(a) shows a prior art intererometer circuit.
Figure 2B:
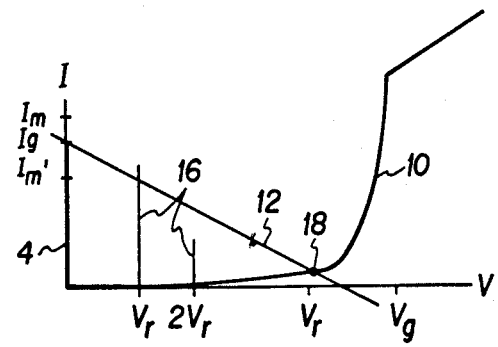
FIG. 2(b) shows its I-V characteristic.
Figure 3A:
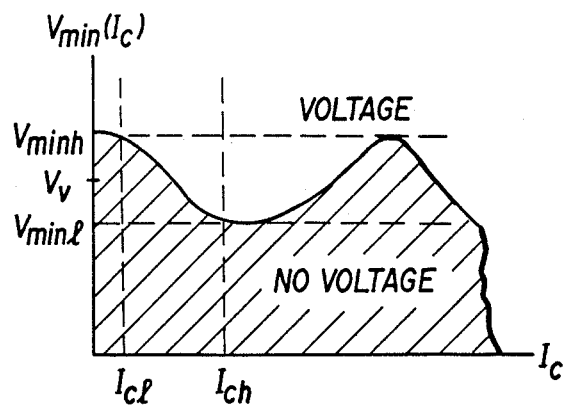
FIGS. 3(a) and 3(b) show curves applicable to Josephson junctions useful for explaining non-latching operation.
Figure 3B:
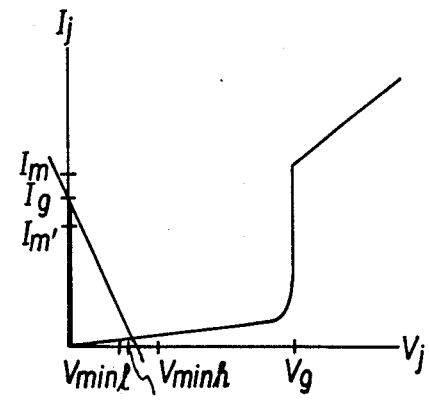

The reduction in capacitance results in a corresponding improvement in switching speed. For circuits like that of FIG. 1(a), the switching time constant is reduced by a factor of $1/N$. For circuits like that of FIG. 1(c), it is reduced by a factor of $1/N^{\frac{1}{2}}$. The intrinsic response time defined above is also correspondingly reduced; if the chosen superconductor is NbN, and if N=100, the intrinsic response time of the switch reduces to about 1 femtosecond in the limit of zero capacitance. The reduction in capacitance can also be used to severely damp the resonances which caused such problems in prior art circuits. As mentioned previously, the resonances in a two-junction interferometer, for example, occur at voltage steps of $(2n+1)V_r$, where $$V_r = \frac{\hbar}{2e} \sqrt{\frac{2}{LC_j}}.$$

(For the purpose of illustration it is assumed that the two junctions have identical capacitance $C_j$.) If the device can be constructed so as to push these steps up above half the gap voltage $V_g$, the severe natural damping of the junctions will prevent the resonances from interfering with circuit operation. This technique was mentioned in Matisoo and Zappe U.S. Pat. No. 3,906,538, mentioned previously, at col. 4, lines 16–32. According to the equation above, however, this would have required a reduction in either the junction capacitance $C_j$ or the interferometer inductance L. Both run afoul of various requirements related to gain, interferometer operating windows, and noise immunity. Reduction of the junction capacitance could have been accomplished by shrinking the area of the junction, but that would have concomitantly reduced $I_m$ into a noisy region. Similarly, interferometer gain and operating window requirements fix L at about $0.25\ \Phi_o/I_m$. If VTJ's made according to the invention are used in place of the Josephson junctions, however, the capacitance can be reduced by whatever factor is needed to push the resonances above half the gap voltage. It should be noted that a VTJ avoids many of the problems of bare Josephson junctions, thereby rendering resort to interferometer-type structures unnecessary. Since for resonance purposes each junction in a VTJ can be treated as a point junction, as described previously, a bare VTJ does not have resonance problems to cause concern.

Another benefit obtained due to reduction of the device capacitance is an increase in the self-resetting voltage $V_{min}$. As discussed previously, $V_{min}$ is given by $$\frac{1}{2} C_j V_{min}^2 = \frac{I_m \Phi_o}{2\pi}.$$

A reduction in the capacitance by a factor of $1/N$ would therefore yield an increase in $V_{min}$ by a factor of $N^{\frac{1}{2}}$. It is consequently no longer important to keep the load resistance at the low level required to obtain nonlatching operation of a prior art junction, thereby permitting the use of narrower and more densely packed transmission lines to carry the output current. It should be noted that individual load resistors are not required for each junction in the stack; a single resistor shunting the entire stack is sufficient since the entire stack acts as a single junction. Moreover, the range of voltage state voltages $V_v$ which will permit nonlatching operation, given by $V_{minh}-V_{minl}$, would also be enlarged by a factor of $N^{\frac{1}{2}}$. This relaxes the tolerance requirements of the load resistor. Both improvements will make it easier to fabricate denser circuits for operation in the nonlatching mode.

A second major advantage that the invention provides over the prior art is voltage gain. An N layer VTJ requires no more control current to switch than does a Josephson junction, yet the unloaded voltage output is increased by a factor of N to $NV_g$. For circuits like that shown in FIG. 1(b), therefore, the switching time constant $\tau_b$ is reduced by a factor of 1/N. This will yield a significant reduction in the time required to transfer current into a loop and therefore a significant reduction in access time for superconducting memories. Also, since the output voltage swing can be made as large as desired, it can be used to directly drive other VTJ's. As a separate matter, the voltage gain capability of vertical tunnel junctions should greatly simplify communications between superconducting and non-superconducting logic circuits.

As a third major advantage of the invention, the VTJ described above is a true three-terminal device. The output is isolated from the input without the addition of artificial isolation means such as coupling transformers. Coupling transformers therefore play no role in limiting the density of circuits that may be fabricated with VTJ's. Isolation may be further improved by using the structure shown in FIG. 4(b), in which the functions of the bottom pair of electrodes have been interchanged. From top to bottom, this structure comprises an output electrode 50, a barrier layer 52, a stack electrode 54, a barrier layer 56, a stack electrode 58, a barrier layer 60, a stack electrode 62, a barrier layer 64, a ground electrode 66, a barrier layer 68, and an input electrode 70. A load 44 is connected across the output and ground terminal 50 and 66. The operation of this structure is much the same as that of FIG. 4(a). A gate current $I_g$ is injected into the output terminal 50 which is below the lowest threshold current for any of the junctions between the output terminal 50 and the ground terminal 66 (called the output stage junctions). It need not, however, be below the threshold current level of the junction between ground terminal 66 and input terminal 70 (the input stage junction), because the gate current is taken out of the stack before it gets there. Assuming the control current $I_c$ is below the threshold or critical current level of the input junction, all the junctions in the stack will be in their zero-voltage state and the voltage across the load will be zero. If the control current increases to a level above the input stage junction critical current, the input junction will switch to the voltage state. The output stage junctions will also switch to their voltage state almost immediately because of the tight coupling from one to the next and to the input stage junction, and thereby deliver current to the load 44. This structure has even better isolation than that of FIG. 4(a), because switching is dependent only on the control current level instead of the sum of $I_c$ and $I_g$. Thus, whereas a small change in $I_g$ could affect the switching characteristics of the structure of FIG. 4(a), it will not in the structure of FIG. 4(b) (unless, of course, the change in $I_g$ is sufficient to cause one or more of the output stage junctions to switch). This improvement is accomplished at the minor expense of one output stage junction: N=4 in FIG. 4(b), whereas N=5 in FIG. 4(a).

As used herein, one junction is "tightly coupled" to another junction if the switching of one due to an external influence causes the other to switch as well. The phenomenon of tight coupling is believed to result from the following. In the k'th junction in a stack or lateral array, the switching threshhold is given by $$I_k=I_0(\Delta) \sin (\phi_k-\phi_{k+1}),$$

where $\phi_k$ is the phase of the k'th electrode and $\phi_{k+1}$ is the phase of the (k+1)'th electrode, immediately across the k'th junction from the k'th electrode. If $\phi_k$ is disturbed, as by switching of the previous ((k-1)'th) junction, the phase difference $\phi_k-\phi_{k+1}$ in the above equation changes so as to reduce the switching threshhold $I_k$. Assuming the stack is biased with a gate current $I_g$, and the disturbance in $\phi_k$ is sufficient, $I_k$ will fall below $I_g$ and cause the junction to switch. The switching of the k'th junction in turn electromagnetically influences $\phi_{k+1}$, the phase of the (k+1)'th electrode. But the (k+1)'th electrode is shared with the next junction in the stack, which itself has a switching threshhold given by $$I_{k+1}=I_0(\Delta) \sin (\phi_{k+1}-\phi_{k+2}).$$

Thus, if the (k+1)'th junction is close enough to the k'th junction so that the electromagnetic influence is strong enough, the disturbance in $\phi_{k+1}$ will cause the (k+1)'th junction to switch, and so on through the entire stack or array. This sequence is referred to herein as a "domino effect".

FABRICATION

Figure 5A:
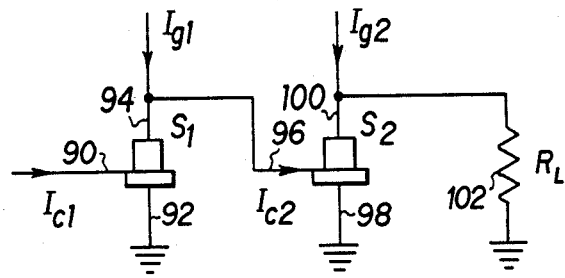
FIGS. 5(a), 6(a), 6(b) and 9 show examples of circuits using a structure according to the present invention.

It will now be described how a vertical tunnel junction according to the invention can be fabricated. The circuit portion shown in FIG. 5(a) will be used for this illustration. It comprises a first VTJ switch $S_1$ having an input lead 90, a ground lead 92 and an output lead 94. The output lead 94 of $S_1$ is connected to an input lead 96 of a second VTJ switch $S_2$, which also has a ground lead 98 and an output lead 100. The output lead 100 of $S_2$ is in turn connected to a load 102 which may be a resistor. The ground leads 92 and 98 of $S_1$ and $S_2$, respectively, are connected to ground. The output leads 94 and 100 are each additionally connected to a source of gate current $I_{g1}$ and $I_{g2}$, respectively, and the input 90 of switch $S_1$ is connected to a source of control current $I_{cl}$. The currents are chosen and the circuit designed so that with $I_{cl}$ below a certain threshold, both switches are in their zero-voltage state and no current is delivered to the load 102. When $I_{cl}$ exceeds the threshold $S_1$ switches to the voltage state, thereby transferring gate current $I_{g1}$ to the input lead 96 of $S_2$, which causes $S_2$ to switch to the voltage state, which in turn transfers gate current $I_{g2}$ to the load 102.

Figure 4B:
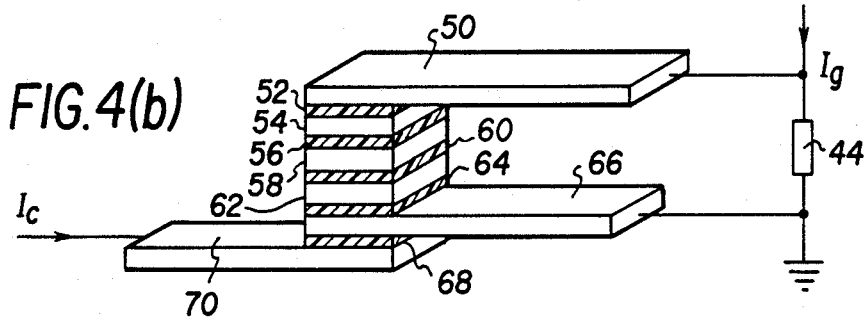

For simplicity, it will be assumed that each switch is of the type shown in FIG. 4(b), though it will be understood that different types of switches, whether or not embodying the present invention, may be used in the same circuit. It will also be assumed that N=50 for both switches, though it will be understood that different N's may be used in the same circuit if desired. It will further be assumed that both switches have only one junction disposed below the ground electrode, though it may be desirable in some circumstances to have more than one.

The circuit is fabricated basically using known techniques for thin film deposition and etching, though the sequence of steps and the resulting structures are novel.

Figure 5B:
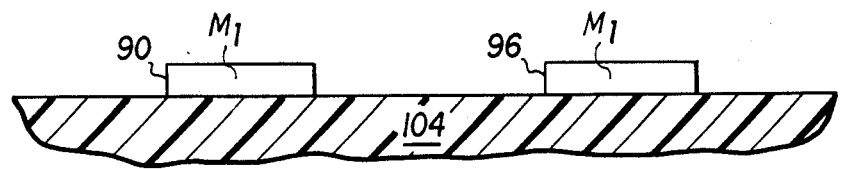
FIGS. 5(b)–5(g) show the circuit of FIG. 5(a) at various stages of fabrication.
Figure 5C:
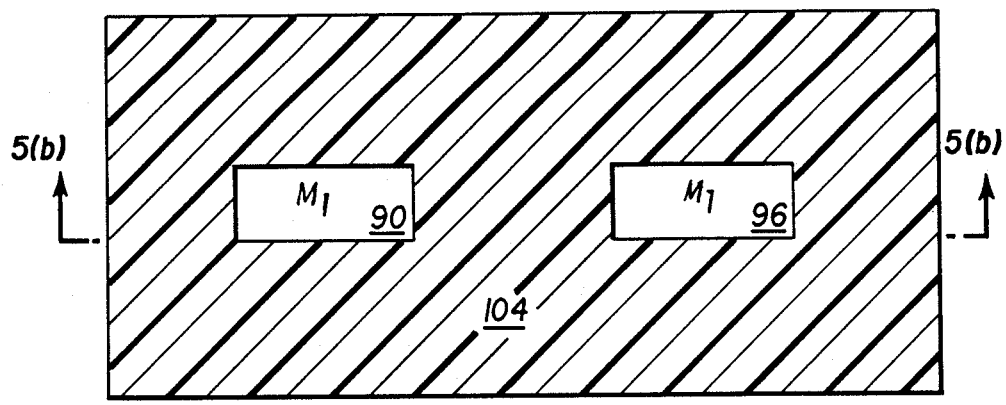
Figure 5D:
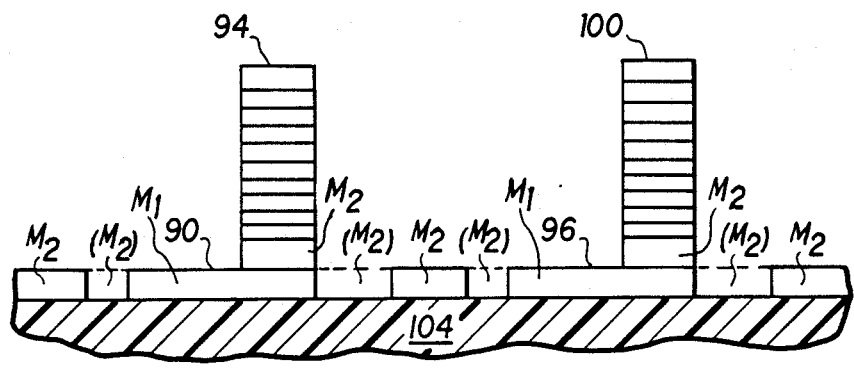
Figure 5E:
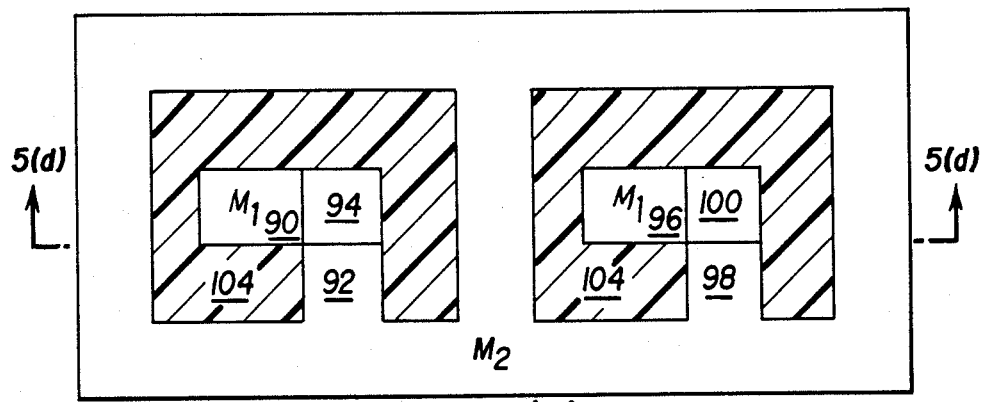
Figure 5F:
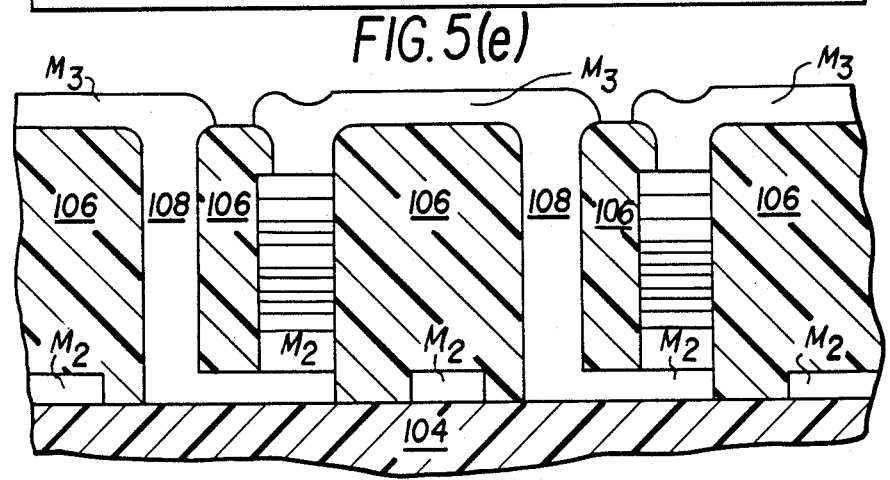
Figure 5G:
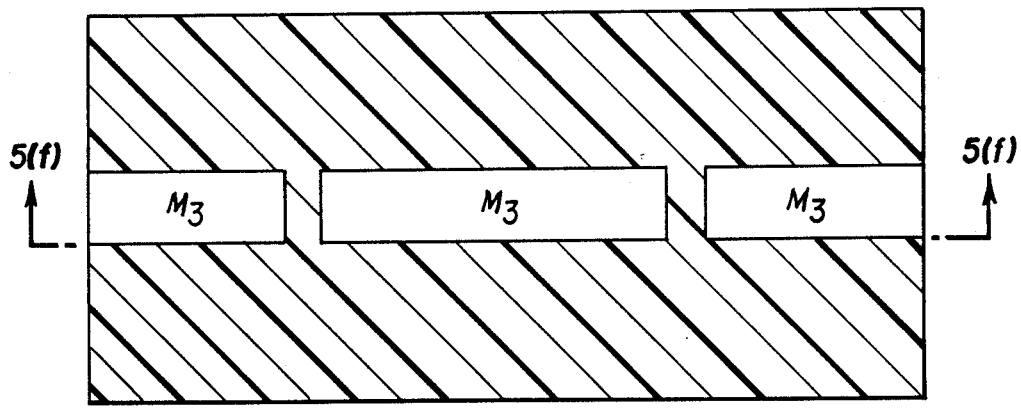

First, a wafer is provided, which may be made of silicon. After some preliminary layers are deposited, a 1000 Å layer $M_1$ of superconductor (e.g., Nb) is deposited on the entire wafer. This layer is then patterned by known etching techniques for it to act as the input electrodes 90 and 96 of switches $S_1$ and $S_2$, respectively. A cross-sectional and a plan view of $M_1$ as so patterned are shown in FIGS. 5(b) and 5(c), respectively, the relevant portion of the wafer as coated with the preliminary layers being designated as 104. Next, a very thin (20 Å) barrier layer is deposited on top of $M_1$, and a second superconducting layer $M_2$, having a thickness of about 1000 Å, is deposited over the entire wafer to act as the ground plane. Then, before any further etching is done, N=50 additional junctions are created by depositing alternately over the entire wafer 20 Å barrier layers followed by 500 Å superconductor layers. These layers are then etched down to the $M_2$ layer to define the stacks for the VTJ's. $M_2$ is then patterned, yielding the structure shown in FIGS. 5(d) and 5(e). It should be apparent in these drawings that the thickness of the layers are drawn greatly out of proportion to their width. The width of the stack is on the order of 2 u, whereas for N=50, the total height is only about 2.5 u. Known planarization techniques are next used to deposit $SiO_2$ insulator over the entire wafer so as to have a flat top at a height about 3000 Å above the superconducting layer at the top of the stacks. Vias are opened in the insulator down to the $M_1$ layer directly over the input electrodes 90 and 96, and a superconductor is deposited or plated up from such electrodes to the top of the insulator. Other vias are then opened over the output electrodes 94 and 100 of the stacks, and a 4000 Å superconductor layer $M_3$ is deposited and patterned for interconnections. The resulting structure is shown in FIGS. 5(f) and 5(g). The $SiO_2$ insulator in these drawings is designated 106 and the superconductor-filled vias are designated 108.

The ground plane $M_2$ is shown in FIG. 5 as covering most of the surface of the wafer, with holes surrounding the VTJ structures. An alternative construction would be to use the layer $M_2$ only for interconnections. In the example of FIG. 5(a), $M_2$ would be used to connect the ground lead 92 of the first switch $S_1$ to (1) the ground lead 98 of the second switch $S_2$, (2) the grounded end of the load 102, and (3) a power return terminal (not shown). This construction is disadvantageous, however, because the absence of a ground plane degrades the performance of the signal-carrying interconnections and in some situations may cause them to radiate energy. A separate, additional ground plane may be formed below $M_1$ to avoid the problem, but this represents an unnecessary additional process step. A second alternative construction would be to form a ground plane below the $M_1$ layer, and make connections from the $M_2$ layer directly to the ground plane where desired. This construction also requires the additional process step for forming the ground plane. The construction shown in FIG. 5 provides a substantially complete ground plane without the additional process step. It should be noted that although the more complete the coverage the better, the ground plane need only parallel the signal-carrying interconnects in order to improve their performance. The fact that a metallization layer ($M_1$) is disposed below the ground plane is contrary to the usual practice, but will not negate the performance improvements it affords.

APPLICATIONS

Figure 6A:
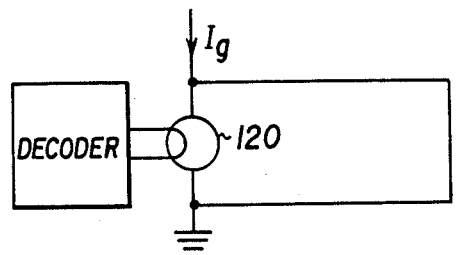
Figure 6B:
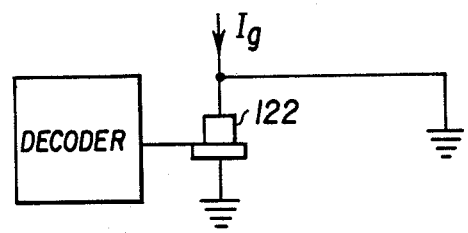

A switch according to the invention is usable in virtually any prior art circuit which formerly employed Josephson junctions or interferometers for analog or digital applications. Thus, for example, a prior art memory access loop such as that shown in FIG. 6(a), which includes a driver gate 120, can be improved significantly in both performance and density by replacing the driver gate 120 with a VTJ transistor 122, as shown in FIG. 6(b). The individual memory cells (not shown) to which the memory access loop is coupled may continue to be coupled thereto inductively, or may be coupled via another VTJ. The latter option, as described previously, would further improve both speed and density.

Logic. A VTJ switch can replace a Josephson junction switch in previously developed logic families and thereby provide improvements in both speed and density. In addition, current may be injected into or taken out of a VTJ at any level thereof, and the voltage across any junction or group of junctions may be used as an output signal. Preliminary indications are that the threshold current levels for different junctions in a stack need not be identical, but rather that they can differ by as much as 10-20% without affecting the ability of the stack to act as a single junction. This flexibility permits the use of a single switch according to the invention to perform a variety of combinational logic functions.

Figure 7:
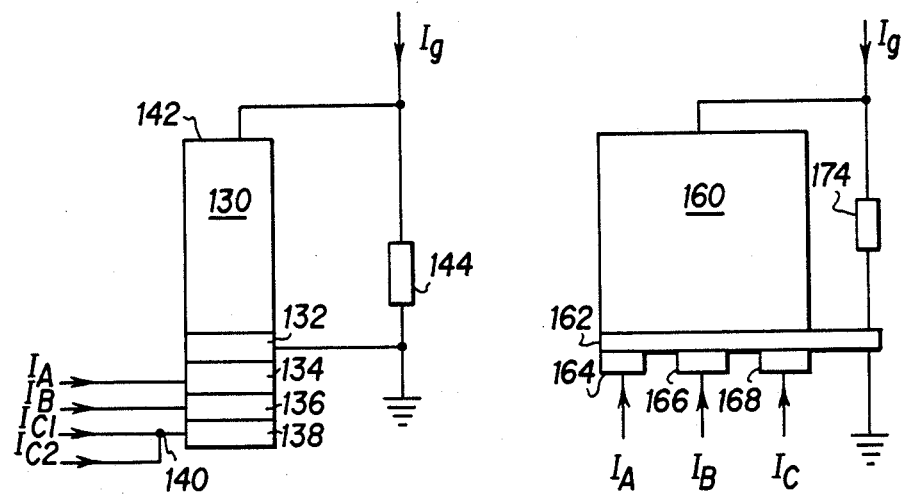

As an example, FIG. 7 shows a VTJ according to the invention wired to perform the function Y=A+B+(C1·C2). It comprises, from top to bottom, an output stage 130 consisting of N junctions (not shown individually), a ground electrode 132, an A input electrode 134, a B input electrode 136, and a C input electrode 138. The A and B electrodes 134 and 136 are connected to A and B signal sources (not shown), respectively, and the C input electrode 138 is connected to a node 140. C1 and C2 signal sources (not shown) are connected to the node 140. The top electrode on the stack 130 is an output electrode 142, and it is connected to both one end of a load 144 and a source (not shown) of gate current. The other end of the load 144 is connected to the ground electrode 132 and to ground. The A and B signal levels are defined to be essentially zero current for a logic 0, and about 1.5 times the junction threshold current for a logic 1. The signal levels for C1 and C2 are defined to be essentially zero current for a logic 0, and about 0.67 times the junction threshold current for a logic 1. The output signal levels are defined to be 0V for a logic 0, and a voltage $V_1$ (which depends on the load) for a logic 1. The gate current $I_g$ is below the lowest threshold of any junction in the output stage, and the load 144 is chosen to render the operation of the output stage 130 non-latching. In operation, as long as all the inputs are at logic 0, all the junctions in the stack are in their zero-voltage state. The voltage across the load 144 is 0V, which corresponds to a logic 0. As soon as one or both of the inputs A or B switch to their logic 1 level, sufficient current is injected from that electrode, through at least one junction, to the ground electrode 132 to cause that at least one junction to switch to the voltage state. By the domino effect described previously, all junctions in the stack also switch, thereby presenting a nonzero voltage, or a logic 1, to the load 144. For the C inputs, neither signal by itself is sufficient to switch a junction; rather, both C1 and C2 must be at their logic 1 level to cause a logic 1 to appear across the load 144. This accomplishes the logical AND function. Moreover, as soon as the inputs return to their logic 0 state, so does the output because the device is designed to be non-latching.

Figure 8:
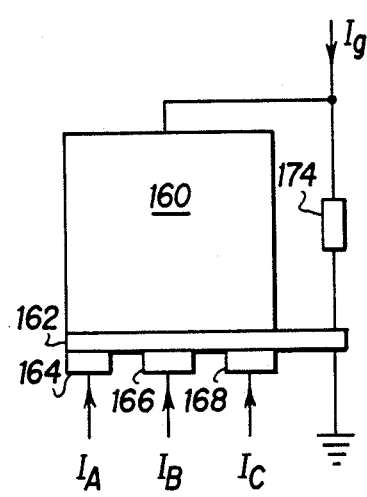

FIG. 8 shows yet another VTJ logic gate, this one taking advantage of the fact that electrodes in a stack, additionally or alternatively to being placed atop one another, may be disposed side by side. The structure comprises, from top to bottom, an output stage 160 consisting of N junctions (not shown individually); a ground electrode 162; and a layer of input electrodes consisting of, from left to right, an A input electrode 164, a B input electrode 166, and a C input electrode 168. The A, B and C input electrodes 164, 166 and 168 are connected to A, B and C signal sources (not shown), respectively. The top electrode of the stack 160 is an output electrode 170, and it is connected both to one end of a load 174 and to a source (not shown) of gate current. The other end of the load 174 is connected to the ground electrode 162 and to ground. Like the A and B inputs in FIG. 7, the A, B and C signal levels in FIG. 8 are all defined to be essentially zero current for a logic 0, and about 1.5 times the junction threshhold for a logic 1. The output signal levels are defined to be 0V for a logic 0, and a voltage $V_1$ for a logic 1. The gate current $I_g$ is below the lowest threshhold of any junction in the output stage, and the load 174 is chosen to render the operation of the output stage 160 non-latching. The VTJ of FIG. 8 operates similarly to that of FIG. 7, in performing the logic function $Y=(A+B+C)$. If all three inputs A, B and C are at their logic 0 levels, all the junctions in the stack will be in their zero-voltage state and a logic 0 will be delivered to the load 174. If any one of the three inputs switches to its logic 1 level, the tight coupling between the junctions will cause all the junctions in the stack (including the other two input stage junctions) to switch virtually simultaneously to their voltage state. A logic 1 will thereby be delivered to the load 174. When the input signal is removed, all junctions will return to their zero-voltage state: the input stage junctions because no current is passing through them, and the output stage junctions because the load 174 makes the output stage junctions non-latching.

Laterally and vertically disposed input stage junctions may be used in any desired combination and quantity. One limitation on laterally disposed input stage junctions is that, in order to be able to consider the VTJ as a stack of point junctions, the largest horizontal distance between any two of such input stage junctions must be less than the Josephson penetration depth of about 1000Å. Additionally, although the output stage 160 of the device in FIG. 8 is shown wide enough to cover all the input stage junctions, there is no necessity for this. The output stage 160 may still be made as narrow as desired, consistent with the fabrication technology used.

SIS Mixer. The vertical construction of the VTJ can be used to advantage in other, non-digital, applications as well, where tight coupling is not essential. In such applications the vertical construction can increase density and reduce parasitics, and thereby improve performance. Although tight coupling may not be essential for these applications, the construction characteristics of a structure which would exhibit tight coupling if used in a digital mode could further improve performance of the device as used in its analog mode. In Tucker, "Predicted Conversion Gain in Superconductor-Insulator-Superconductor Quasiparticle Mixers." *Appl. Phys. Lett.,* Vol. 36, pp. 477-479 (1980), there is described an analog mixer using a Mixers," *Appl. Phys. Lett.,* Vol. 36, pp. 477-479 (1980), there is described an analog mixer using a superconductor-insulator-superconductor (SIS) structure as the nonlinear element. The structure is basically a Josephson junction biased at approximately the gap voltage $V_g$. The extreme nonlinearity of the I-V characteristic at this point is responsible for the mixing, the Josephson current itself playing no part in the operation of the device. SIS mixers are advantageous because they operate in the millimeter and submillimeter wavelength range, because they are capable of very high conversion gain, and because they have the lowest noise temperature of any mixer known. However, one-junction SIS mixers have a limited dynamic range and are difficult to construct with the impedance necessary to deliver full power to typical useful loads.

Kerr et al. reported the construction of an SIS mixer comprising a lateral series array of $N=14$ junctions. Kerr, et al., "Infinite Available Gain in a 115 GHz SIS Mixer", *Physica.* Vol. 108B, pp. 1369-1370. See also Rudner, et al., "The Antenna-Complex SIS Quasiparticle Array Mixer," *IEEE Trans. on Magnetics.* Vol. MAG-17, pp. 690-693 (1981), which reports experiments performed on six-junction array mixers. For the purposes of SIS quasiparticle mixing, these N junction lateral arrays have an effective overall gap voltage of $NV_g$. This is true even though they do not achieve the tight coupling which would be achieved for switching purposes in lateral (or vertical) arrays if they are constructed according to the invention. This increase in the effective gap voltage results in a much improved dynamic range and increased design flexibility in matching the mixer output to a load. The total series capacitance of the mixer is also reduced by a factor of N, thereby permitting higher frequency operation. However, as mentioned in the Rudner paper, lateral arrays have much higher parasitic capacitance and inductance than do single junction mixers, because of the proportionally larger area they occupy. Spreading the mixer over such a large area also reduces circuit density and complicates the distribution of the RF energy.

Figure 9:
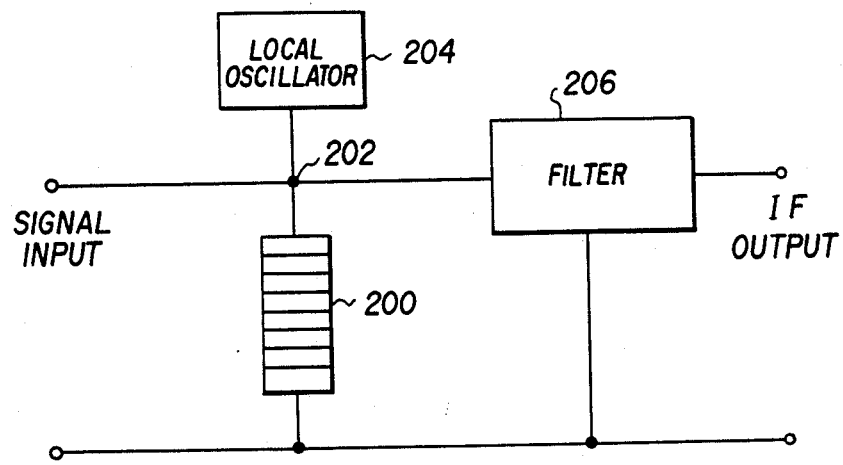

According to the invention, the above problems may be avoided by constructing the mixer element as an array of junctions stacked vertically. Such a mixer is shown in FIG. 9, and comprises an N-junction VTJ 200, the top layer of which is connected to a node 202 and the bottom layer of which is connected to common. The node 202 is connected to a signal source (not shown), the output of a local oscillator 204, and the input of a filter 206. The output of the filter 206 constitutes the IF output of the mixer. Appropriate biasing circuitry (not shown) is also included as may be a magnetic field generator to suppress the Josephson effect currents.

The structure of FIG. 9 achieves the advantages of an array mixer without incurring the disadvantages of increased parasitics, reduced density and complex means for distributing RF power. Additionally, the number N of junctions used may be significantly higher than the number that may be used in the lateral case before the parasitics overcome the usefulness of the device. The spacing between junctions in the VTJ mixer may also be made far smaller than that permissible by today's fabrication technology for lateral arrays, but this is not necessary in the non-digital application.

OTHER VARIATIONS

In those of the above circuit configurations which use a VTJ as digital switch, direct coupled current injection is used for switching the first junction. ("First" is used here in a temporal sense). It will be understood, however, that any known method may be used for that purpose. Thus, a VTJ may be switched by injecting photons, phonons, quasiparticles (e.g. from a Quiteron), microwaves or any other particles into any of the superconducting layers so as to suppress the superconducting gap of such layer. Prior art inductively coupled control signals can also be used. Similarly, these means are equally applicable to switches with laterally arrayed tightly coupled junctions.

Figure 10:
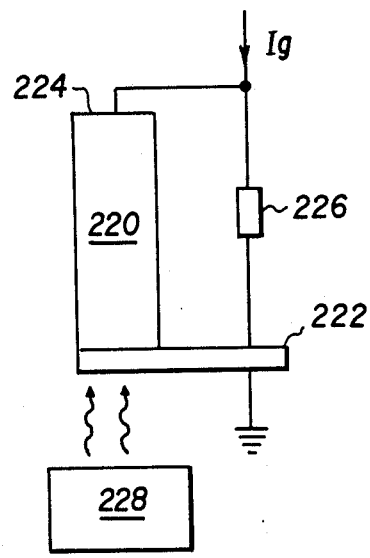

In FIG. 10 there is shown an example of a VTJ switch according to the invention in which the first junction is switched by superconducting gap reduction means instead of by direct current injection. It comprises an output stage 220 consisting of N output stage junctions (not shown individually), and a ground electrode 222 at the bottom of the output stage 220. As with previously described embodiments, the top electrode is an output electrode 224 which is connected to a source (not shown), of bias current $I_g$ and to a load 226. The other end of the load 226 is connected to the ground electrode 222 and to ground. The diagram of FIG. 10 further shows a gap suppression means 228. The gap suppression means 228 may comprise any means for suppressing the superconducting gap of any electrode or electrodes in the stack, and may comprise, for example, particle or quasiparticle injection means (such as an electron beam cathode); photon injection means (such as a laser); or phonon injection means (such as a high frequency crystal vibrator). In operation, all the junctions in the stack are in their zero-voltage state when the gap suppression means 228 is inactive. When the gap suppression means becomes active, it drives down the gap of the affected electrode(s). As previously mentioned, the threshhold current for the k'th junction in a stack is given by $$I_k = I_0(\Delta) \sin (\phi_k - \phi_{k+1}).$$

A sufficient reduction in the gap $\Delta$ will reduce the maximum critical current $I_o$, hence reducing the threshhold current $I_k$. When $I_k$ is driven down below the bias current $I_g$, the junction will switch and, via the domino effect, will cause all the other junctions in the stack to switch as well. It will be apparent that different gap suppression means may be used in combination with each other, and/or in combination with current injection means. It will furthermore be apparent that different means for switching a junction may be applied to different junctions at different levels of the stack, since all the junctions in the stack will switch (assuming tight coupling) regardless of which are switched first or what caused the first one to switch.

The invention has been described with respect to particular embodiments thereof, and it will be understood that numerous variations are possible, all within the scope of the invention.

What is claimed is:

1. A switch for a superconducting integrated circuit, comprising:
   first and second Josephson tunnel junction;
   means for injecting a current through the first junction which exceeds the critical current of the first junction to cause the first junction to switch to the voltage state; and
   means for tightly coupling the second junction to the first junction such that switching of the first junction causes the second junction to switch.

2. A switch according to claim 1, wherein the means for tightly coupling comprises an electrode of the first junction which is also an electrode of the second junction.

3. A switch according to claim 2, wherein the first junction and the second junction are stacked vertically.

4. A switch according to claim 1, further comprising: a third Josephson tunnel junction; and means for tightly coupling the third junction to the second junction.

5. A switch according to claim 4, wherein the first, second and third junctions are stacked vertically.

6. A switch according to claim 1, further comprising:
   a third Josephson tunnel junction; and
   means for tightly coupling the third junction to the first junction.

7. A switch according to claim 1, further comprising means for reducing the critical current of the first junction.

8. A switch according to claim 1, further comprising means for injecting photons into the first junction to reduce the critical current of the first junction.

9. A switch according to claim 1, further comprising means for injecting phonons into the first junction to reduce the critical current of the first junction.

10. A switch according to claim 1, further comprising means for injecting quasiparticles into the first junction to reduce the critical current of the first junction.

11. A switch according to claim 2, further comprising means for injecting quasiparticles into the first junction to reduce the critical current of the first junction.

12. A switch for a superconducting integrated circuit, comprising:
   first and second Josephson tunnel junctions;
   means for injecting a first current through the first junction, the first current having a level below the critical current level of the first junction;
   means for depressing the critical current level of the first junction to below the first current level to cause the first junction to switch to the voltage state; and
   means for tightly coupling the second junction to the first junction such that the switching of the first junction causes the second junction to switch.

13. A switch for a superconducting integrated circuit, comprising:
   first and second Josephson tunnel junctions;
   means for injecting a first current through the first junction, the first current having a level below the critical current level of the first junction;
   means, magnetically coupled to the means for injecting a first current, for increasing the first current to a level above the critical current level of the first junction to cause the first junction to switch to the voltage state; and
   means for tightly coupling the second junction to the first junction such that switching of the first junction causes the second junction to switch.

14. A superconducting integrated circuit comprising a switch, the switch comprising at least two Josephson junctions, each of the at least two junctions being series-connected to and tightly coupled to the immediately adjacent ones of the at least two juctions, the circuit further comprising:

means for passing a bias current through the at least two junctions; and means for passing an input current through an input portion of the at least two junctions, the input portion constituting less than all of the at least two junctions, the input current being capable of a first level which when added to the bias current is less than the lowest of the critical currents of all the junctions in the input portion, and a second level which when added to the bias current is greater than the lowest of the critical currents of all the junctions in the input portion; and means for switching the input current from the first level to the second level to cause the input portion to switch to a voltage state.

15. A superconducting integrated circuit comprising a switch, the switch comprising an input stage and an output stage, the input stage comprising at least one series connected input stage Josephson junction, each series connected input stage junction being tightly coupled with all immediately, adjacent ones of the series connected input stage junctions, the output stage comprising at least one series connected output stage Josephson junction, each series connected output state junction being tightly coupled with all immediately adjacent ones of the series connected output stage junctions, all of the series connected output stage junctions being distinct from all of the series connected input stage junctions, one of the series-connected input stage junctions being tightly coupled with one of the series connected output stage junctions; the circuit further comprising:

means for passing a bias current through a first group of the series connected output stage junctions, the bias current having a level which is less than the lowest threshhold current level of any junction in the first group;

means for passing an input current through a second group of the series connected input stage unctions, the input current being capable of a first level which is less than the lowest threshhold current level of any junction in the second group, and a second level which is greater than the lowest threshhold current level of any junction in the second group; and means for switching the input current from the first level to the second level to cause the second group to switch to a voltage state.

16. A circuit according to claim 15, wherein the input stage comprises at least two series-connected input stage junctions.

17. A circuit according to claim 16, wherein the first group comprises all of the connected output stage junctions.

18. A super conducting integrated circuit comprising a switch, the switch comprising an input stage and an output stage, the input stage comprising a first input stage Josephson junction, the output stage comprising at least one series connected output stage Josephson junction, each series connected output stage junction being tightly coupled with all immediately adjacent series connected one of the output stage junctions, the first input stage junction being distinct from all of the series connected output stage junctions and tightly coupled with a first one of the series connected output stage junctions; the circuit further comprising:

means for passing a bias current through a first group of the series connected output stage junctions, the bias current having a level which is less than the lowest threshold current level of any junction in the first group;

means for passing a first input current through the first input stage junction, the first input current being capable of a first level which is below the threshhold current level of the first input stage junction, and a second level which is above the threshhold current level of the first input stage junction; and means for switching the first input current from the first level to the second level to cause the first input stage junction to switch to a voltage state.

19. A circuit according to claim 18, the input stage further comprising a second input stage Josephson junction distinct from all of the series connected output stage junctions and tightly coupled with the first one of the series connected output stage junctions; the circuit further comprising:

means for passing a second input current through the second input stage junction, the second input current being capable of a third level which is below the threshold current level of the second input stage junction, and a fourth level which is above the threshold current level of the second input stage junction; and means for switching the second input current from the third level to the fourth level.

20. A circuit according to claim 19, wherein the first group comprises all of the series connected output stage junctions.

21. A circuit according to claim 18, further comprising load means connected to the output stage for operating the series connected output stage junctions in the nonlatching mode.

22. A circuit according to claim 18, wherein the series connected output stage junctions are stacked vertically.

23. A circuit according to claim 18, further comprising an additional switch, the additional switch comprising an additional input stage and an additional output stage, the additional input stage comprising an additional input stage Josephson junction, the additional output stage comprising at least one series connected additional output stage Josephson junction, each series connected additional output stage Josephson junction being tightly coupled with all immediately adjacent series connected ones of the additional output stage junctions, the additional input stage junction being distinct from all of the series connected additional output stage junctions and tightly coupled with one of the series connected additional output stage junctions; the circuit further comprising:

means for passing an additional input current through the additional input stage junction, the additional input current being capable of a first additional level which is below the threshhold current level of the additional input stage junction, and a second additional level which is above the threshhold current level of the additional input stage junction; and means responsive to the state of the series connected output stage junctions for switching the additional input current from the first additional level to the second additional level.

24. A vertical tunnel junction comprising:
a first superconducting electrode;
a first thin barrier layer formed above the first superconducting electrode;
a second superconducting electrode formed above the first barrier layer, the first thin barrier layer and the second superconducting electrode being adapted to form with the first superconducting electrode a first Josephson junction;
a second thin barrier layer formed above the second superconducting layer; and
a third superconducting layer formed above the second thin barrier layer, the second thin barrier layer and the third superconducting electrode being adapted to form with the second superconducting electrode a second Josephson junction and one of said electrodes being adapted to receive an externally-injected current which exceeds the critical current of at least one Josephson junction so formed.

25. A vertical tunnel junction according to claim 24, wherein the first Josephson junction is tightly coupled to the second Josephson junction.

26. Apparatus comprising a vertical tunnel structure, the vertical tunnel structure comprising a bottom superconducting electrode and a vertically stacked plurality of layer pairs formed over the bottom electrode, each layer pair comprising a superconducting electrode formed over a thin barrier layer, the superconducting electrodes and the barrier layers being adapted such that each layer pair forms with its subadjacent superconducting electrode a Josephson junction and one of said electrodes being adapted to receive an externally-injected current which exceeds the critical current of at least one of said Josephson junctions so formed.

27. Apparatus according to claim 26, further comprising:
a filter having input and an output;
a local oscillator;
a common lead;
means for coupling the local oscillator, the input of the filter and a signal source to a first electrode in the vertical tunnel structure; and
means for coupling the common lead to a second electrode in the vertical tunnel structure, the first electrode being separated from the second electrode by at least one additional electrode.

28. Apparatus according to claim 17, further comprising means for applying a voltage bias to the vertical tunnel structure.

29. Apparatus according to claim 26, wherein the vertical tunnel structure further comprises means for tightly coupling each junction in the vertical tunnel structure to all is adjacent junctions in the vertical tunnel structure.

30. Apparatus according to claim 30, further comprising:
means for passing an input current through a first one of the junctions via the said electrode adapted to receive current, the apparatus being capable of a first state in which the input current is below the threshold current level of the first one of the junctions and a second state in which the input current is above the threshold current level of the first one of the junctions; and
means for changing the input current such that the first one of the junctions switches from the zero-voltage state to the voltage state and the apparatus switches from the first state to the second state.

31. Apparatus according to claim 29, further comprising:
means for passing through a first one of the junctions, via the said electrode adapted to receive current, a bias current which has a level below threshhold current level of the first one of the junctions when the superconducting gap of a first one of the electrodes of the first one of the junctions is at a first level; and
means for suppressing the superconducting gap of the first one of the electrodes to a level at which the threshold current level of the first one of the junctions is below the bias current level.

32. Apparatus according to claim 31, wherein the means for suppressing the superconducting gap comprises means for injecting photons into the first one of the electrodes.

33. Apparatus according to claim 31, wherein the means for suppressing the superconducting gap comprises means for injecting phonons into the first one of the electrodes.

34. Apparatus according to claim 31, wherein the means for suppressing the superconducting gap comprises means for injecting quasiparticles into the first one of the electrodes.

35. Apparatus according to claim 29, further comprising:
means for injecting an input current through a first group of adjacent junctions in the structure via the said electrode adapted to receive current, the first group comprising at least one junction; and
means for injecting a bias current through a second group of adjacent junctions in the structure, the second group comprising at least one junciton not in the first group;
the input current being capable of a first level corresponding to a first logic level and a second level higher than the level corresponding to a second logic level;
the first level being chosen to be too low to cause any junction in the first group to switch from the zero-voltage state to the voltage state; and
the second level being chosen such that at least one junction in the first group will switch from the zero-voltage state to the voltage state when the input current changes from the first level to the second level.

36. A switch for a superconducting integrated circuit comprising (a) a plurality of Josephson junctions connected in series relationship with each other and disposed in such proximity to each other that the switching of one of the junctions in the plurality from the zero-voltage state to the voltage state will cause all of the other junctions in the plurality to switch form the zero-voltage state to the voltage state via the domino effect and (b) means for injecting a current through one of the junctions in the plurality which exceeds the critical current of at least one junction to cause the at least one junction to switch into the voltage state.

37. A switch according to claim 36, wherein the junctions in the plurality are stacked vertically.

38. Apparatus implementing a superconducting circuit, the circuit comprising:
- a vertical tunnel junction, the vertical tunnel junction having, from bottom to top, an input superconducting electrode, a ground superconducting electrode and at least one output stage superconducting electrode, each electrode being separated from its adjacent electrodes by a thin barrier layer;
- means for generating an input signal;
- means for accepting an output signal;
- an input lead connecting the means for generating an input signal to the input electrode; and
- an output lead connecting the means for accepting an output signal to a first one of the at least one output stage electrodes;

the apparatus comprising:
- a support;
- an M1 superconducting layer formed over the support, the M1 layer being patterned to comprise the input electrode;
- an M2 superconducting layer formed over the M1 layer and the support, the M2 layer being patterned to comprise the ground electrode;
- an M3 superconducting layer formed the M2 layer, the M1 layer and the support, the M3 layer being patterned to comprise the first one of the output stage electrodes;
- an input superconducting interconnect adapted to comprise the input lead; and
- an output superconducting interconnect adapted to comprise the output lead;
- wherein the M2 layer is patterned further to comprise a first portion substantially coincident with a projection of the input superconducting interconnect onto the M2 layer and a second portion substantially coincident with a projection of the output superconducting interconnect onto the M2 layer.

39. Apparatus implementing a superconducting circuit, the circuit comprising:
- a vertical tunnel junction, the vertical tunnel junction having, from bottom to top, an input superconducting electrode, a ground superconducting electrode and at least one output stage superconducting electrode, each electrode being separated from its adjacent electrodes by a thin barrier layer;
- means for generating an input signal; and
- an input lead connecting the means for generating an input signal to the input electrode;

the apparatus comprising:
- a support;
- an M1 superconducting layer formed over the support, the M1 layer being patterned to comprise the input electrode;
- an M2 superconducting layer formed over the M1 layer and the support, the M2 layer being patterned to comprise the ground electrode;
- an M3 superconducting layer formed over the M2 layer, the M1 layer and the support, the M3 layer being patterned to comprise the first one of the output stage electrodes; and
- an input superconducting interconnect adapted to comprise the input lead;
- wherein the M2 layer is patterned further to comprise a first portion substantially coincident with a projection of the input superconducting interconnect onto the M2 layer.

40. Apparatus implementing a superconducting circuit, the circuit comprising:
- a vertical tunnel junction, the vertical tunnel junction having, from bottom to top, an input superconducting electrode, a ground superconducting electrode and at least one output stage superconducting electrodes, each electrode being separated from its adjacent electrodes by a thin barrier layer;
- means for accepting an output signal;
- an output lead connecting the means for accepting an output signal to a first one of the at least one output stage electrodes;

the apparatus comprising:
- a support;
- an M1 superconducting layer formed over the support, the M1 layer being patterned to comprise the input electrode;
- an M2 superconducting layer formed over the M1 layer and the support, the M2 layer being patterned to comprise the ground electrode;
- an M3 superconducting layer formed over the M2 layer, the M1 layer and the support, the M3 layer being patterned to comprise the first one of the output stage electrodes;
- an output superconducting interconnect adapted to comprise the output lead;
- wherein the M2 layer is patterned further to comprise a second portion substantially coincident with a projection of the output superconducting interconnect onto the M2 layer.

41. Apparatus implementing a superconducting circuit, the circuit comprising a vertical tunnel junction, the vertical tunnel junction having, from bottom to top, an input superconducting electrode, a ground superconducting electrode and at least one output stage superconducting electrode, each electrode being separated from its adjacent electrodes by a thin barrier layer; the apparatus comprising:
- a support;
- an M1 superconducting layer formed over the support, the M1 layer being patterned to comprise the input electrode;
- an M2 superconducting layer formed over the M1 layer and the support, the M2 layer being patterned to comprise the ground electrode;
- an M3 superconducting layer formed over the M2 layer, the M1 layer and the support, the M3 layer being patterned to comprise the first one of the output stage electrodes; and
- wherein the M2 layer is patterned to further comprise a ground plane covering substantially the entire support.

42. A switch for a superconducting integrated circuit, comprising:
- first and second Josephson tunnel junctions;
- means for injecting a first current through the first junction, the first current having a level below the critical current level of the first junction;
- means for injecting a second current through the first junction such that the sum of the first and second currents exceeds the critical current level of the first junction to cause the first junction to switch to the voltage state; and
- means for tightly coupling the second junction to the first junction such that the switching of the first junction causes the second junction to switch.

43. A switch according to claim 42, further comprising means for reducing the critical current level of the first junction.

* * * * *

UNITED STATES PATENT AND TRADEMARK OFFICE
CERTIFICATE OF CORRECTION

PATENT NO. : 4,837,604

DATED : June 6, 1989

INVENTOR(S) : Sadeg M. Faris

It is certified that error appears in the above-identified patent and that said Letters Patent is hereby corrected as shown below: On the title page:

Abstract Column, line 13, "combination" should read --combinational--.

Column 1, line 50, "$\frac{}{2\Delta}$" should read --$\frac{\hbar}{2\Delta}$--.

Column 2, lines 3 and 4, "an improvement appears because two series - connected capacitors $C_j$ (in italics) should read --an improvement appears because two series - connected capacitors $C_j$--.

Column 3, line 9, "$\frac{}{2e}$" should read --$\frac{\hbar}{2e}$--.

Column 4, line 28, "Magnetics (in italics)" should read --Magnetics--.

Column 5, line 43, "affect" should read --effect--.

Column 7, line 7, "intererometer" should read --interferometer--.

Column 8, line 18, "$\frac{}{2e}$" should read --$\frac{\hbar}{2e}$--.

UNITED STATES PATENT AND TRADEMARK OFFICE
CERTIFICATE OF CORRECTION

PATENT NO. : 4,837,604

DATED : June 6, 1989

INVENTOR(S) : Sadeg M. Faris

It is certified that error appears in the above-identified patent and that said Letters Patent is hereby corrected as shown below:

Column 8, line 59, "by a factor of (in italics)" should read --by a factor of--.

Column 10, line 12, "k-1'th" should read --k-1'th--.

Column 10, lines 37 and 39, "$S_1$ (in italics)," should read --$S_1$--.

Column 10, lines 48 and 49, "$I_{c1}$ (in italics)" should read --$I_{c1}$--.

Column 12, line 61, "that at least" should read --at least--.

Column 14, line 1, "(1980)" should read --(1980)--.

Column 14, lines 2, 3 and 4, delete "Mixers, Appl. Phys. Lett., Vol. 36, pp 477-479 (1980), there is described an analog mixer using a".

Column 15, line 66, "junction;" should read --junctions;--.

Column 16, line 67, "juctions," should read --junctions,--.

Column 17, line 43, "unctions," should read --junctions,--.

Column 17, line 57, "connected" should read --series-connected--.

UNITED STATES PATENT AND TRADEMARK OFFICE
CERTIFICATE OF CORRECTION

PATENT NO. : 4,837,604

DATED : June 6, 1989

INVENTOR(S) : Sadeg M. Faris

It is certified that error appears in the above-identified patent and that said Letters Patent is hereby corrected as shown below:

Column 17, line 59, "super conducting" should read --superconducting--.

Column 17, line 68, "one" should read --ones--.

Column 19, line 54, "17" should read --27--.

Column 19, line 60, "is" should read --its--.

Column 19, line 62, "30" should read --29--.

Column 20, line 41, "junciton" should read --junction--.

Column 21, line 24, "formed the" should read --formed over the--.

Signed and Sealed this

Twenty-eighth Day of August, 1990

Attest:

HARRY F. MANBECK, JR.

*Attesting Officer*      *Commissioner of Patents and Trademarks*